(12) United States Patent
Woodward et al.

(10) Patent No.: US 9,013,200 B2
(45) Date of Patent: Apr. 21, 2015

(54) CIRCUITRY FOR HOT-SWAPPABLE CIRCUIT BOARDS

(75) Inventors: Ray Woodward, Windsor, CO (US);
Samuel M. Babb, Fort Collins, CO (US); Kelly Pracht, Tomball, TX (US); Jack Lavier, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 544 days.

(21) Appl. No.: 13/387,654

(22) PCT Filed: Dec. 4, 2009

(86) PCT No.: PCT/US2009/066763
§ 371 (c)(1),
(2), (4) Date: Jan. 27, 2012

(87) PCT Pub. No.: WO2011/068517
PCT Pub. Date: Jun. 9, 2011

(65) Prior Publication Data
US 2012/0119775 A1    May 17, 2012

(51) Int. Cl.
*G01R 31/00* (2006.01)
*G06F 1/26* (2006.01)
*G01R 19/165* (2006.01)

(52) U.S. Cl.
CPC ............... *G06F 1/26* (2013.01); *G01R 19/165* (2013.01)

(58) Field of Classification Search
CPC .... B67D 1/0005; H05K 13/0486; G06F 1/26; G01R 19/165
See application file for complete search history.

(56) References Cited

U.S. PATENT DOCUMENTS

| | | | |
|---|---|---|---|
| 6,865,063 B2* | 3/2005 | Ball | 361/93.9 |
| 2004/0177201 A1 | 9/2004 | Cherniski et al. | |
| 2005/0068085 A1 | 3/2005 | Nalbant | |
| 2007/0208958 A1* | 9/2007 | Wakamatsu | 713/300 |

FOREIGN PATENT DOCUMENTS

JP    2002032151    1/2002

* cited by examiner

*Primary Examiner* — Tung X Nguyen
(74) *Attorney, Agent, or Firm* — Hewlett-Packard Patent Department

(57) ABSTRACT

Electronic circuits and methods are provided for use in hot-swappable circuit board applications. Circuitry detects an electrical ground connection and signals operation of a hot-swap controller. Detection of stable operating power causes a hierarchical startup of plural voltage regulators. Sensing stable output power from the last of the voltage regulators triggers the configuration of one or more programmable devices. Circuitry and other resources of a hot-swappable circuit board are protected against electrical transient-related damage by virtue of the present teachings.

15 Claims, 5 Drawing Sheets

CIRCUITRY FOR HOT-SWAPPABLE CIRCUIT BOARDS

CROSS-REFERENCE TO RELATED APPLICATION

This application is a national stage application under 35 U.S.C. §371 of PCT/US2009/066763, filed Dec. 4, 2009.

BACKGROUND

Computer servers, process control instrumentation and other electronic systems are increasingly based on the use of hot-swappable circuit boards and cards. Under an ideal hot-swappable architecture, boards or cards may be removed from and installed in a supporting backplane without power-down or significant interruptions to operation. This makes hot-swappable design desirable in various redundant and/or critical application scenarios.

However, electronic advancements have resulted in integrated circuit chips and other devices that are prone to damage due to voltage spikes and other electrical transients. Hot-swappable circuit boards that use such sensitive devices require protective measures in order to avoid damage during the remove-and-replace process. The present teachings are directed to the foregoing and other related concerns.

BRIEF DESCRIPTION OF THE DRAWINGS

The present embodiments will now be described, by way of example, with reference to the accompanying drawings, in which.

DETAILED DESCRIPTION

Introduction

Means and methods for protecting hot-swappable circuit boards are provided by the present teachings. On-board circuitry detects an electrical ground connection and signals operation of a hot-swap controller. Detection of stable operating power causes a hierarchical startup of plural voltage regulators. Stable output power from the last of the voltage regulators is detected, triggering the configuration of one or more programmable devices. Circuitry and other resources of a hot swappable circuit board are protected against electrical transient-related damage by virtue of the present teachings.

In one embodiment, an electronic circuit is configured to assert a first signal in response to detecting an electrical ground connection to a hot-swappable circuit board. The electronic circuit is also configured to assert a second signal in response to detecting a normal condition of a source of electrical power connected to the hot-swappable circuit board. Additionally, a third signal is asserted in response to detecting a normal output of a voltage regulator onboard the hot-swappable circuit board by way of the electronic circuitry. Furthermore, the electronic circuitry is configured to assert a fourth signal in response to an assertion of the third signal for a predetermined period of time.

In another embodiment, a method includes detecting a normal electrical connection between a hot-swappable circuit board and a source of electrical power. The method also includes performing a hierarchical startup sequence of a plurality of voltage regulators in response to the detecting. Additionally, the method includes sensing stable electrical output from a predetermined one of the plurality of voltage regulators. The method further includes configuring one or more programmable devices of the hot-swappable circuit board in response to the sensing.

First Illustrative System

Figure 1:
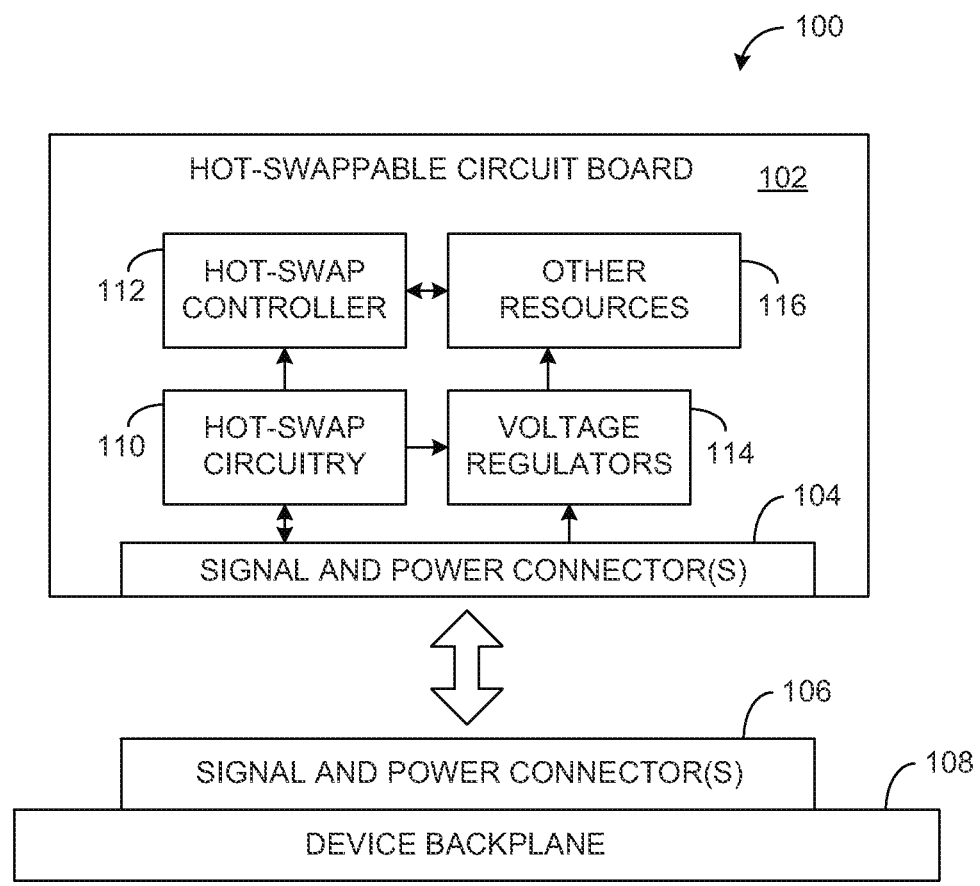
FIG. 1 depicts a block diagram of a system according to one embodiment.

Reference is now directed to FIG. 1, which depicts a block diagram of a system 100. The system 100 is illustrative and non-limiting with respect to the present teachings. Thus, other systems can be configured and/or operated in accordance with the present teachings.

The system 100 includes a hot-swappable circuit board (HSCB) 102. The HSCB 102 includes one or more electrical connectors 104 that are configured to electrically engage one or more corresponding connectors 106 of a device backplane 108. Electrical power and various electrical signals can be communicated between the HCSB 100 and other resources by way of the electrical connectors 104 and 106.

The HCSB 100 also includes hot-swap circuitry 110 according to the present teachings. The hot-swap circuitry 110 is coupled to the connector 104 so that electrical ground, power and various signals can be used, communicated or monitored in accordance with the present teachings. The hot-swap circuitry 110 is also in power or signal communication with other resources of the HSCB 102 as described hereinafter.

The HCSB 100 also includes a hot-swap controller 112. The controller 112 is coupled to receive signals from various resources of the HCSB 100 including the hot-swap circuitry 110. The controller 112 is configured to control various operations of the HCSB 100 during installation or removal with respect to the backplane 108 during a hot-swap scenario.

The HCSB 100 also includes a plurality of voltage regulators 114. Each of the voltage regulators 114 is configured to receive electrical power by way of the connectors 104 and to provide a respective regulated operating voltage to the HCSB 100. In one embodiment, the HCSB 100 includes four voltage regulators 114 configured to receive twelve volts direct-current (DC) power by way of the connector 104, and to provide regulated outputs of one-point-two volts, three-point-three volts, two-point-five volts and one-point-eight volts, respectively. Other configurations having other numbers of regulators or respective voltages can also be used according the present teachings.

The HCSB 100 further includes other resources 116 in accordance with the normal application and use of the HCSB 100. Non-limiting examples of such other resources 116 include one or more microprocessors, state machines, analog circuitry, digital circuitry, hybrid circuitry, application-specific integrated circuits (ASICs), solid-state memory, field-programmable gate arrays (FPGAs) data storage devices, wireless circuitry or devices, etc. In other words, numerous hot-swappable circuit boards 100 can be configured and directed to respectively different applications in accordance with the present teachings. The particular other resources 116 and their respective normal operations are not germane to the present teachings and further elaboration is not required.

Illustrative normal operations of the hot-swappable circuit board 100, according to the present teachings, are as follows: the HCSB 100 is to be installed into the system 100 having the device backplane 108. A user electrically couples the respective connectors 104 and 106 together by inserting a card edge into an edge connector, joining one or more electrical wiring harnesses, plugging various jacks into corresponding sockets, etc. The particular electromechanical form of the respective connectors 104 and 106 is not crucial to the present teachings. One having ordinary skill in the electrical arts can appreciate that numerous suitable connectors 104 and 106 can be used accordingly.

Once electrical connections are established between the connectors 104 and 106, the hot-swap circuitry 110 provides a signal to the controller 112 indicating a valid electrical ground connection. This signal to the controller 112 is also referred to as an "enable" signal for purposes herein. The hot-swap circuitry 110 also detects that main electrical power (e.g., twelve volts, nineteen volts, etc.) is present and stable at one or more nodes onboard the HCSB 100 and provides one or more corresponding signals to the controller 112 and the other resources 116.

The hot-swap circuitry 110 further operates to signal the startup of the plural voltage regulators 114 of the HSCB 102. In turn, the voltage regulators 114 are configured to startup or energize, in a predetermined hierarchical sequence. In one illustrative and non-limiting embodiment, four voltage regulators 114 startup in the following order: one-point-two volts, then three-point-three volts, then two-point-five volts, and finally one-point-eight volts. Other embodiments having other numbers of voltage regulators (two, three, five, etc.), respective voltages or hierarchical orders can also be used.

Such hierarchical startup is also interdependent. That is, a lower ranking voltage regulator 114 cannot startup until all voltage regulators of higher rank (regardless of respective voltages) are successfully started and operating normally. In the illustrative example described above, the lowest ranking regulator 114 is not started up or operated unless all of the higher ranking voltage regulators 114 are successfully operating.

The hot-swap circuitry 110 further provides signaling indicating that the final (i.e., lowest ranking) voltage regulator 114 is providing a stable output voltage. This signal is used to initiate the configuration of various programmable devices of the other resources 116 of the HSCB 102. Non-limiting examples of such programmable devices include field-programmable gate arrays (FPGAs), microcontrollers, microprocessors, dedicated-purpose programmable devices, etc.

After such configuration is complete, the HCSB 100 can perform its normal operations by way of the other resources 116. In this way, the hot-swap circuitry 110 serves to initiate startup of the hot-swappable circuit board 100 in a controlled and sequential manner based upon detection of valid power and signal connections. Damage due to electrical transients is avoided. Illustrative and non-limiting embodiments of hot-swap circuitry 110 are described in detail below.

First Illustrative Embodiment

Figure 2:
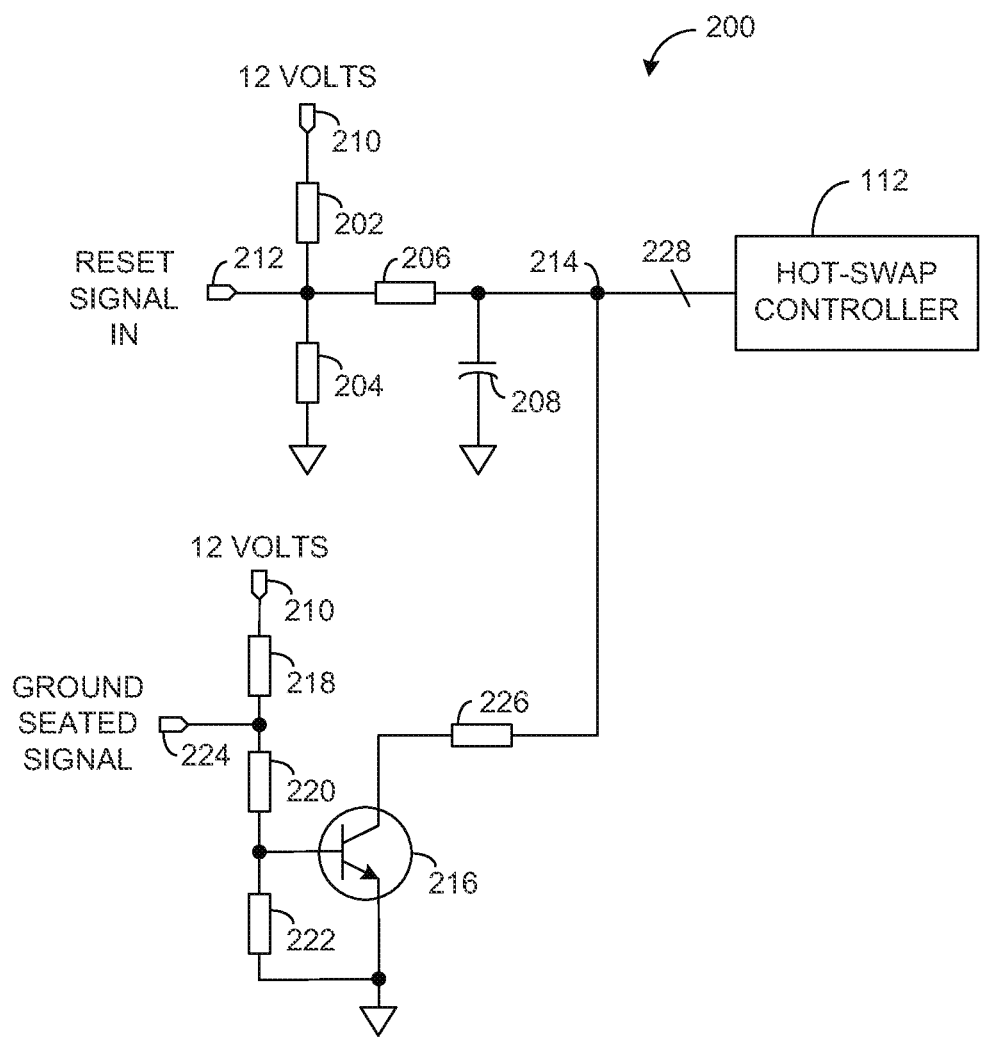
FIG. 2 is a schematic diagram depicting circuitry according to one embodiment.

Attention is now turned to FIG. 2, which depicts a schematic diagram of electronic circuitry 200 according to one embodiment. The circuitry 200 is illustrative and non-limiting with respect to the present teachings. The circuitry 200 is also understood to comprise a portion of the hot-swap circuitry 110 according to one embodiment. Thus, other circuits are contemplated by the present teachings.

The circuitry 200 includes the hot-swap controller 112 as introduced above. The circuitry 200 also includes respective resistors 202, 204 and 206, and a capacitor 208. The components 202-208, inclusive, define circuitry coupled to a source of electrical power at a node 210 and to a reset signal input at a node 212. The components 202-208, inclusive, are further electrically coupled to a node 214.

The circuitry 200 also includes a transistor 216 and respective resistors 218, 220 and 222. The resistors 218-222, inclusive, are coupled to electrical power at the node 210 and to an electrical ground signal at a node 214. The resistors 218-222, inclusive, are configured to define a biasing network electrically coupled to a control node of the transistor 216. In turn, output signaling from the transistor 216 is coupled to the node 214 by way of a resistor 226.

Normal operation of the circuitry 200 is as follows: Main electrical power (e.g., twelve volts, etc.) at node 210 is reduced by a voltage divider comprising resistors 202 and 204. A resulting reduced voltage signal 228 is coupled to the node 214 by way of resistor 214. The capacitor 208 serves to filter the voltage signal 228 at the node 214. Simultaneously, the biasing circuitry comprising resistors 218-222 serves to forward bias the transistor 216. In turn, the electrically conductive state of the transistor 216 serves to pull the voltage signal 228 down to (or toward) ground potential.

Now, it is assumed that a ground potential signal is present at the node 224, indicative of a normal and stable electrical ground connection between a hot-swappable circuit board (e.g., 102) and corresponding connectors 106. This ground signal at node 224 effectively disrupts the biasing of the transistor 216 so that an electrically non-conductive state thereof is assumed. The signal 228 is no longer pulled toward ground potential and the controller 112 is effectively signaled to assume normal operations. This operative state of the controller 112 is continued for so long as the ground potential remains at node 224.

In general and without limitation, the circuitry 200 operates to enable normal operation of the hot-swap controller 112 when a valid, stable electrical ground signal is present at node 224. Such a ground signal is understood to correspond to a normal electrical ground connection between a hot-swappable circuit board 102 and the various power and signal connections provided by a corresponding device backplane 108.

In one embodiment, a ground signal at node 224 is present when an HCSB 102 is fully seated in an edge connector 106. Other embodiments having other connector types can also be used. Table 1 below provides illustrative and non-limiting values and identifications for components of the circuitry 200 according to one embodiment:

TABLE 1

Illustrative Circuitry 200

| Element/Device | Value/Model | Notes/Vendor |
| --- | --- | --- |
| Resistor 202 | 2.21K Ohms | 1%/(any vendor) |
| Resistor 204 | 8.25K Ohms | 1%/(any vendor) |
| Resistor 206 | 301 Ohms | 1%/(any vendor) |
| Capacitor 208 | 10.0 uF | 10 V/(any vendor) |
| Transistor 216 | PMBT3904 | NXP Semiconductor |
| Resistor 218 | 4.64K Ohms | 1%/(any vendor) |
| Resistor 220 | 4.64K Ohms | 1%/(any vendor) |
| Resistor 222 | 4.64K Ohms | 1%/(any vendor) |
| Resistor 226 | 22.0 Ohms | 1%/(any vendor) |

Figure 3:
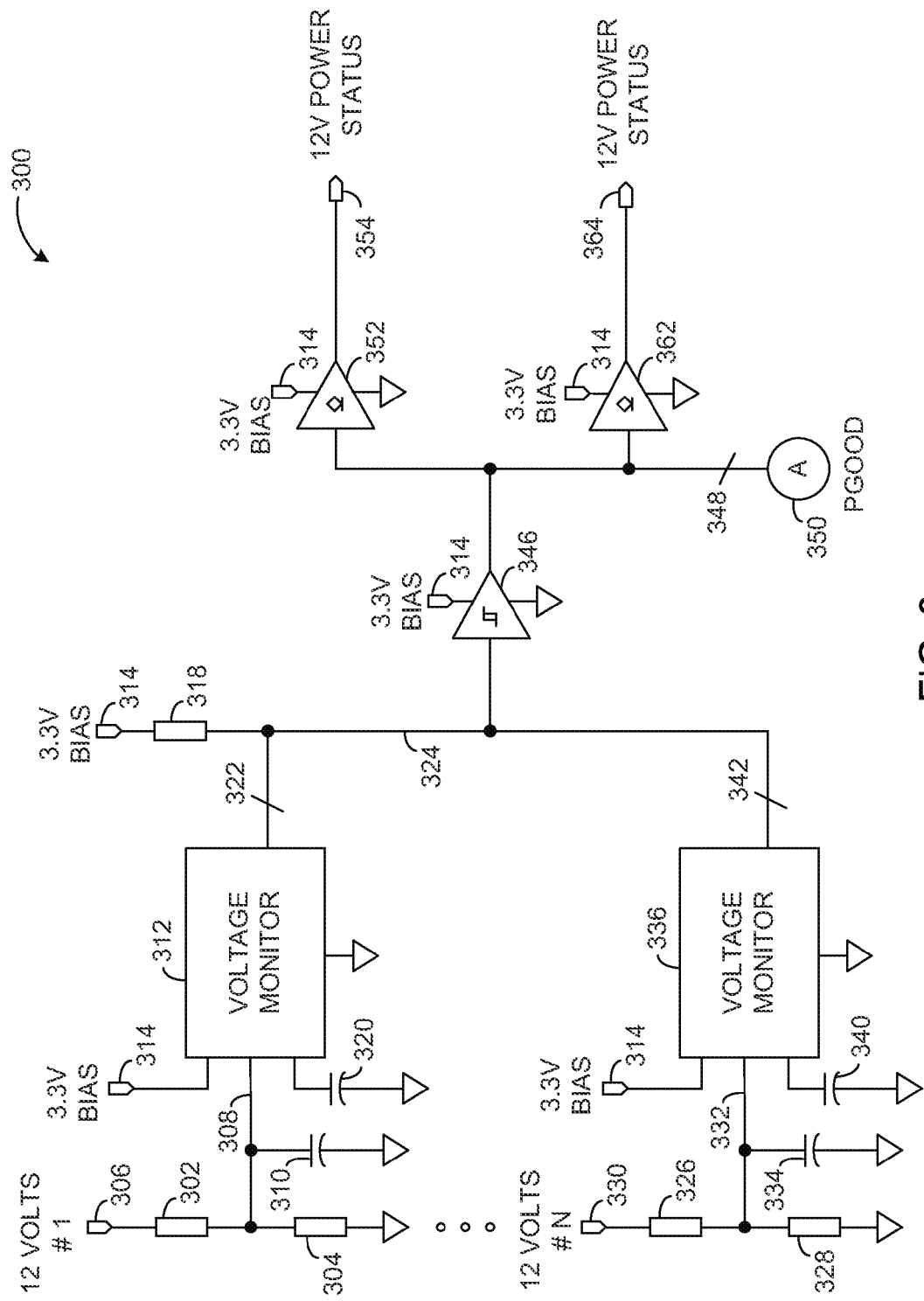
FIG. 3 is a schematic diagram depicting circuitry according to one embodiment.

Referring now to FIG. 3, which depicts a schematic diagram of electronic circuitry 300 according to one embodiment. The circuitry 300 is illustrative and non-limiting with respect to the present teachings. The circuitry 300 is also understood to comprise a portion of the hot-swap circuitry 110 according to one embodiment. Thus, other circuits are contemplated by the present teachings.

The circuitry 300 includes resistors 302 and 304 configured to define a voltage divider, electrically coupled to a node 306 and electrical ground. Operating power (e.g., twelve volts DC, etc.) is present on the node 306 during normal operations of the HSCB 102 and a corresponding, lesser voltage is derived by the voltage divider at a node 308. A capacitor 310 filters the voltage signal at node 308.

The circuitry 300 also includes a voltage monitor 312. In one embodiment the voltage monitor 312 is defined by a model MAX6420 available from Maxim Integrated Products, Inc., Sunnyvale, Calif., USA. Other suitable voltage monitors can also be used. The voltage monitor 312 is coupled to the voltage signal at node 308 and to operating (or biasing) power at a node 314. The voltage monitor 312 is also coupled to ground potential by way of a capacitor 320.

The voltage monitor 312 is configured to provide an output signal 322 at a node 324 when the voltage at the node 308 remains above a predetermined threshold for a predetermined period of time. That is, the voltage monitor 312 asserts the signal 322 "high" when the voltage at node 308—corresponding to the operating power at node 306—is determined to be stable and equal to or greater than a minimum threshold value. In general terms, the voltage monitor 312 provides a signal 322 indicating that the operating power at node 306 is stable and sufficient to energize normal operations for at least a portion of the hot-swappable circuit board 102. As depicted, the operating power at node 306 corresponds to a portion of the HSCB 102. A pull-up resistor 318 biases the signal 324 toward the voltage present at node 314 when the signal 324 is not being asserted "low" by the voltage monitor 312.

The circuitry 300 includes resistors 326 and 328 are configured to define a voltage divider that is electrically coupled to a node 330 and electrical ground. Operating power (e.g., twelve volts DC, etc.) is present on the node 330 during normal operations of the HSCB 102 and a corresponding, lesser voltage is derived by the voltage divider at a node 332. A capacitor 334 filters the voltage signal at node 332.

The circuitry 300 also includes a voltage monitor 336. In one embodiment the voltage monitor 336 is defined by a model MAX6420 available from Maxim Integrated Products, Inc., Sunnyvale, Calif., USA. Other suitable voltage monitors can also be used. The voltage monitor 336 is coupled to the voltage signal at node 332 and to operating power at the node 314. The voltage monitor is also coupled to ground potential by way of a capacitor 340.

The voltage monitor 336 is configured to assert a "high" output signal 342 at the node 324 when the voltage at the node 332 remains above a predetermined threshold for a predetermined period of time. That is, the voltage monitor 336 provides asserts the signal 342 "high" when the voltage at node 332 is determined to be stable and equal to or greater than a minimum threshold value. In general, the voltage monitor 336 provides (or asserts) a signal 342 indicating that the operating power at node 330 is stable and of sufficient voltage to energize normal operations for a portion of the hot-swappable circuit board 102. As depicted, the operating power at node 330 corresponds to another portion of the HSCB 102.

It is noted that the signals 322 and 342 must both be asserted "high" or a signal level conflict occurs. For purposes of non-limiting illustration, it is assumed that a valid "high" signal at node 324 indicates that operating power is stable and sufficient at both nodes 306 and 330. Such a valid "high" state is referred to herein as a "power good" signal. If a "low" or invalid signal is present at the node 324, then it is assumed that at stable and sufficient operating power is not present at nodes 306 or 330, or both (i.e., power "not good").

The circuitry 300 also includes a hysteresis buffer 346 that is coupled to operating power at the node 314 and to electrical ground. The buffer 346 is further configured to receive the signal at node 324 and buffer a corresponding signal 348 to a node 350. The signal 348 is also referred to herein as "pgood".

The illustrative electronic circuitry 300 is configured to detect and provide a "pgood" signal corresponding to the presence or absence of operating power at two distinct nodes (306 and 330). In another embodiment, circuitry is configured and used to provide a "pgood" signal corresponding to operating power at some other number of nodes (one, three, four, etc.). Thus, the present teachings contemplate other electronic circuits corresponding to respectively varying numbers of operating power nodes.

The circuitry 300 further includes a buffer 352 coupled to receive the signal 348 and to buffer it to an output node 354. The signal at output node 354 can be used to alert various other resources 116 of an HSCB 102 that operating power is valid or valid, accordingly. The particular routing and use of the signal at the output node 354 is not germane to the present teachings, and one having ordinary skill in the electrical arts can appreciate that such a signal can be variously applied.

The circuitry 300 further includes a buffer 362 coupled to receive the signal 348 and to buffer it to an output node 364. The signal at output node 364 can be used to alert various other resources 116 of an HSCB 102 that operating power is valid or invalid, accordingly. The particular routing or use of the signal at the output node 364 is not germane to the present teachings. One having ordinary skill in the electrical arts can appreciate that such a signal can be variously applied.

In general, the circuitry 300 monitors operating power supplied to one or more nodes of a hot-swappable circuit board 102 for stability and sufficient voltage. In turn, one or more signals (e.g., 348) indicative of the good or no-good status of such operating power are derived and provided for signaling other aspects of the hot-swap circuitry 110 or other resources 116. Table 2 below provides illustrative and non-limiting values and identifications for components of the circuitry 300 according to one embodiment:

TABLE 2

Illustrative Circuitry 300

| Element/Device | Value/Model | Notes/Vendor |
| --- | --- | --- |
| Resistor 302 | 10K Ohms | 1%/(any vendor) |
| Resistor 304 | 1.5K Ohms | 1%/(any vendor) |
| Capacitor 310 | 22.0 nF | 25 V/(any vendor) |
| Monitor 312 | MAX6420 | Maxim I.P., Inc. |
| Resistor 318 | 4.64K Ohms | 1%/(any vendor) |
| Capacitor 320 | 47.0 nF | 25 V/(any vendor) |
| Resistor 326 | 10K Ohms | 1%/(any vendor) |
| Resistor 328 | 1.5K Ohms | 1%/(any vendor) |
| Capacitor 334 | 22.0 nF | 25 V/(any vendor) |
| Monitor 336 | MAX6420 | Maxim I.P., Inc. |
| Capacitor 340 | 47.0 nF | 25 V/(any vendor) |
| Buffer 346 | SN74AUP1G17 | Texas Instruments, Inc. |
| Buffer 352 | SN74AUP1G07 | Texas Instruments, Inc. |
| Resistor 360 | 4.64K Ohms | 1%/(any vendor) |
| Buffer 362 | SN74AUP1G07 | Texas Instruments, Inc. |
| Resistor 366 | 100K Ohms | 1%/(any vendor) |

Figure 4:
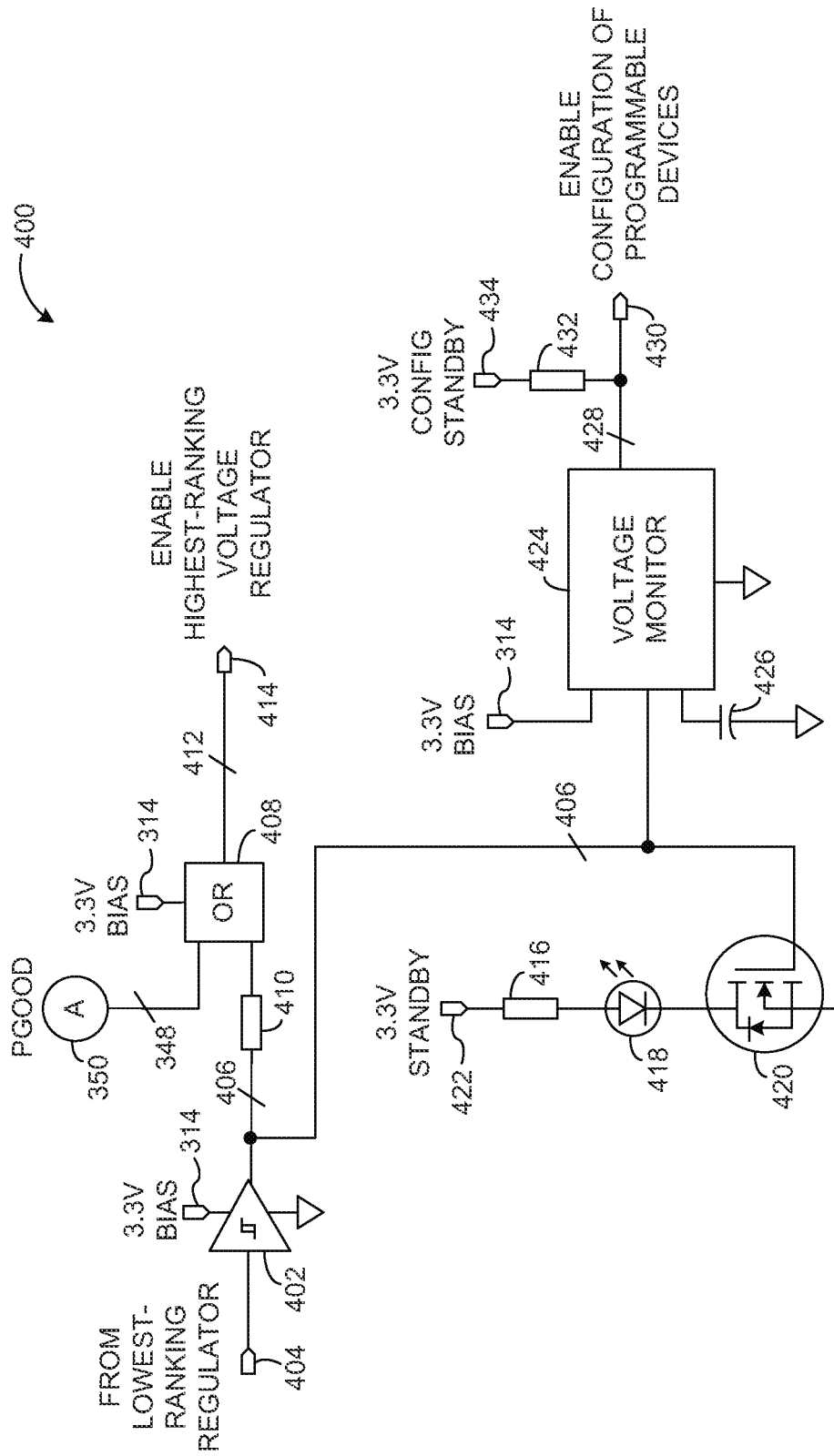
FIG. 4 is a schematic diagram depicting circuitry according to one embodiment.

Attention is now directed to FIG. 4, which depicts a schematic diagram of electronic circuitry 400 according to one embodiment. The circuitry 400 is illustrative and non-limiting with respect to the present teachings. The circuitry 400 is also understood to comprise a portion of the hot-swap circuitry 110 according to one embodiment. Thus, other circuits are contemplated by the present teachings.

The circuitry 400 includes a hysteresis buffer 402 that is coupled to electrical power at the node 314. The buffer 402 is also coupled to receive a voltage signal at a node 404 indicative of the operational state of the lowest ranking voltage regulator. The buffer 402 provides a corresponding signal 406.

In one embodiment, an asserted signal at node 406 indicates that the final voltage regulator in a hierarchy of such voltage regulators 114 is operating normally. For purposes herein, the signal 406 is also referred to as a regulator good or "reg-good" signal.

The circuitry 400 includes an OR logic gate 408. The OR gate 408 is coupled to electrical power at node 314. The OR logic 408 is also coupled to receive the "pgood" signal 348 at node 350 and the "reg-good" signal 406 by way of a resistor 410. The OR gate 402 then provides an output signal 412 at a node 414 corresponding to a logical OR operation on the respective signals 348 and 406. If either (or both) of signals 348 or 406 is asserted, the output signal 412 is also asserted. Otherwise, the output signal 412 is not asserted. The output signal 412 is also referred to as an "enable regulators" or "reg-enable" signal.

The circuitry 400 further includes a resistor 416, a light-emitting diode (LED) 418 and a transistor 420. The elements 416-420, inclusive, are coupled to a "standby" source of electrical potential at a node 422. As depicted, the voltage at node 422 is three-point-three volts DC. Other suitable voltages can also be used. The LED 418 is configured to illuminate when the signal 406 is asserted "high".

The circuitry 400 also includes a voltage monitor 424. The voltage monitor 424 is coupled to electrical power at node 314, and to ground potential by way of a capacitor 426. The voltage monitor 424 is configured to receive the "reg-good" signal 406 and to provide a corresponding output signal 428 to a node 430. The output signal 428 is asserted "high" when the signal 406 has been asserted and stable for a predetermined period of time. The output signal 428 is also referred to as "configuration enable" or "config" signal for purposes herein. A pull-up resistor 432 is configured to pull the signal 428 at node 430 toward a node 434 potential when not otherwise driven "low".

Normal, illustrative operation of the circuitry 400 is as follows: assertion of the "pgood" signal 348 causes the OR logic 408 to assert the "reg-enable" signal 412. The signal 412 is coupled, for non-limiting example, to cause startup of the voltage regulators 114 in a predetermined hierarchical sequence. Once all of the voltage regulators 114 are up and running normally, a corresponding signal from the lowest-ranking (last initiated) voltage regulator 114 is provided to the hysteresis buffer 402.

The hysteresis buffer 402 then asserts the signal 406 "high", which is provided to the OR logic 408 and the voltage monitor 424. In turn, the transistor 420 is biased into conduction by the asserted signal 406 and the LED 418 illuminates accordingly. After a predetermine stabilization period has passed, the voltage regulator 424 asserts the "config" signal 428 "high". The signal 428 is coupled so as to cause (or initiate) the configuration of one or more programmable devices of the hot-swappable circuit board 102. Once the configuration sequence is completed, the HSCB 102 is fully operational and ready to perform its various normal operations.

It is noted that the OR logic 408 will continue to assert "reg-enable" signal 412 in the absence of the "pgood" signal 348, provided that the signal 406 is still asserted. Thus, loss of main operating power (e.g., twelve volts, etc.) to the HCSB 102 does not result in immediate shutdown or loss of control onboard the HCSB 102. Rather, the voltage regulators 114 are enabled to continue operation from power storage such as charged capacitors, etc., of the HCSB 102 while an orderly shutdown is performed. Such an orderly shutdown can be initiated, for non-limiting example, by a transition of the "pgood" signal 348 from an asserted to non-asserted state. Other loss of main power detection stratagems can also be used to initiate a predetermined shutdown sequence.

Table 3 below provides illustrative and non-limiting values and identifications for components of the circuitry 400 according to one embodiment:

TABLE 3

Illustrative Circuitry 400

| Element/Device | Value/Model | Notes/Vendor |
|---|---|---|
| Buffer 402 | SN74AUP1G17 | Texas Instruments, Inc. |
| OR Logic 408 | SN74AUP1G32 | Texas Instruments, Inc. |
| Resistor 410 | 22.0 Ohms | 1%/(any vendor) |
| Resistor 416 | 200 Ohms | 1%/(any vendor) |
| LED 418 | Green | 1.8 V/(any vendor) |
| Transistor 420 | BSS123 | Fairchild Semiconductor |
| Monitor 424 | MAX6420 | Maxim I.P., Inc. |
| Capacitor 426 | 4700 pF | 50 V/(any vendor) |
| Resistor 432 | 4.64K Ohms | 1%/(any vendor) |

First Illustrative Method

Figure 5:
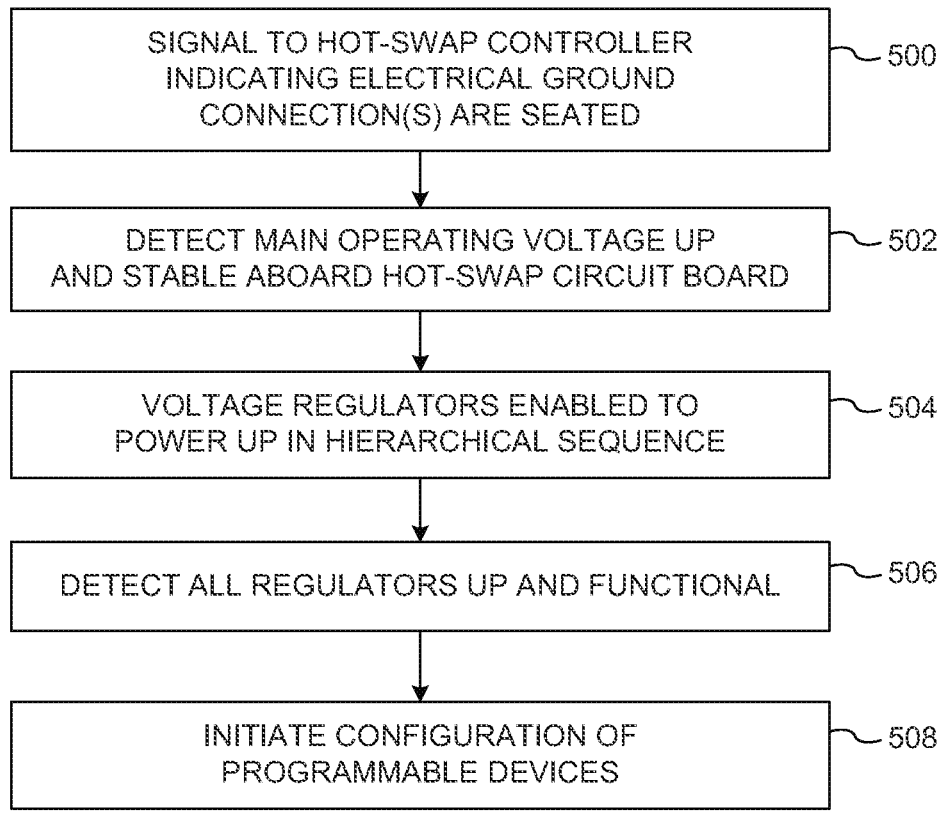
FIG. 5 is a flow diagram depicting a method according to one embodiment.

FIG. 5 is a flow diagram depicting a method according to one embodiment of the present teachings. The method of FIG. 5 includes particular operations and order of execution. However, other methods including other operations, omitting one or more of the depicted operations, and/or proceeding in other orders of execution can also be used according to the present teachings. Thus, the method of FIG. 5 is illustrative and non-limiting in nature. Reference is also made to FIGS. 1-4 in the interest of understanding the method of FIG. 5.

At 500, a signal is provide to a hot-swap controller indicating that an electrical ground connection(s) is/are seated. For purposes of non-limiting example, it is assumed that a connector 104 of an HSCB 102 is fully seated into a corresponding connector 106 and that a valid electrical ground connection is established. In turn, a corresponding signal 228 is provided to a hot-swap controller 112 of the HSCB 102.

At 502, main operating voltage provided is detected to be up and stable aboard the hot-swappable circuit board. For purposes of the ongoing example, it is assumed that twelve volts operating power are provided to the HSCB 102 by way of the connectors 104 and 106. Additionally, it is assumed that a "pgood" signal 348 is asserted and coupled to various circuits and components of the HSCB 102.

At 504, voltage regulators are enabled to start-up in a hierarchical sequence. For purposes of the ongoing example, it is assumed that a "reg-enable" signal 412 is asserted and a plurality of voltage regulators 114 are energized in a predetermined, hierarchical sequence. In one embodiment, a HSCB 102 includes four regulators that are signaled to start-up in order as follows: one-point-two volts, then three-point-three volts, then two-point-five volts and finally one-point-eight volts. Other sequences or voltages can also be used.

At 506, the successful start-up of all voltage regulators is detected. For purposes of the ongoing example, it is assumed that valid voltage (e.g., one-point-eight volts, etc.) at a node 404 results in the assertion of a "reg-good" signal 406.

At 508, the configuration of programmable devices is initiated. For purposes of the ongoing example, it is assumed that a voltage monitor 424 responds to a stable condition of the "reg-good" signal 406 by asserting a "config" signal 428. The asserted signal 428 is coupled to so that one or more programmable devices (e.g., other resources 116) of the hot-swappable circuit board 102 are initialized and configured for normal operation. Non-limiting examples of such programmable devices include field-programmable gate arrays, microcontrollers executing program code from onboard storage, etc.

The foregoing method is illustrative of any number of methods contemplated by the present teachings. In general, and without limitation, a hot-swappable circuit board is coupled to one or more corresponding connectors of a system backplane or other architecture. A valid electrical ground connection between the backplane and the HSCB is detected and a corresponding signal is provided to a hot-swap controller. Valid and stable operating power such as, for example, twelve volts DC is also detected and a corresponding signal is asserted. Plural voltage regulators onboard the HSCB are started up in a predetermined, hierarchical sequence.

Successful operation of the last voltage regulator is detected and a corresponding status signal is asserted. Initialization and startup of programmable devices of the HSCB is performed in response to the voltage regulator status signal. The hot-swappable circuit board is then fully operational and normal functions thereof can be performed.

Second Illustrative Method

Figure 6:
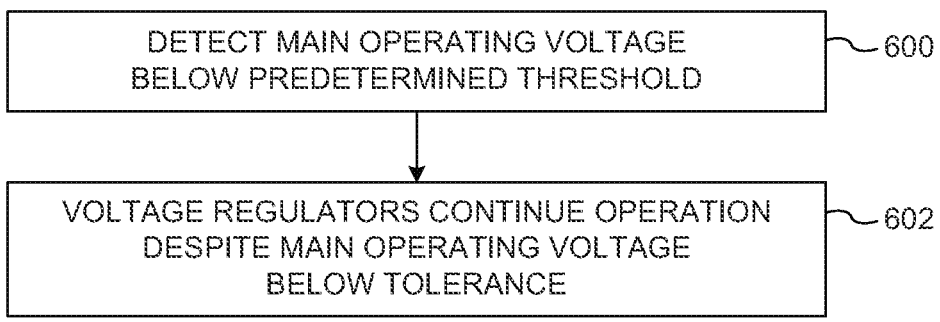
FIG. 6 is a flow diagram depicting a method according to another embodiment.

FIG. 6 is a flow diagram depicting a method according to one embodiment of the present teachings. The method of FIG. 6 includes particular operations and order of execution. However, other methods including other operations, omitting one or more of the depicted operations, and/or proceeding in other orders of execution can also be used according to the present teachings. Thus, the method of FIG. 6 is illustrative and non-limiting in nature. Reference is also made to FIG. 1-4 in the interest of understanding the method of FIG. 6.

At 600, main operating voltage is sensed as being below a predetermined threshold value. For purposes of non-limiting example, it is assumed that a HSCB 102 is disconnected from a corresponding backplane 108 by a user. In turn, the main operating voltage is detected as failed and a "pgood" signal 348 is un-asserted in response. It is noted that such a signal is routed to OR logic 408.

At 602, voltage regulators are enabled to continue to operation despite the sub-tolerance condition of the main operating voltage. For purposes of the ongoing example, it is assumed that the unasserted state of the "pgood" signal 348 causes an orderly shutdown of the HSCB 102. However, it is also assumed that an asserted "reg-good" signal 406 causes continued assertion of the "reg-enable" signal 412. In this way, voltage regulators 114 of the HSCB 102 continue operating from stored power (capacitors, etc.) while the shutdown operation is performed.

The foregoing method is illustrative of any number of methods contemplated by the present teachings. In general, and without limitation, a user disconnects a hot-swappable circuit board from a corresponding backplane, causing a discontinuance of operating power from the backplane to the HSCB. Signaling onboard the HSCB causes an orderly shutdown to begin, while voltage regulators are signaled to continue operation during the shutdown as long a stored electrical power is sufficient.

In general, the foregoing description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

What is claimed is:

1. A hot-swappable circuit board comprising:
   a programmable device;
   a hot-swap circuit to detect an electrical connection between the hot-swappable circuit board and a source of electrical power; and
   a plurality of voltage regulators to startup, in response to the detecting, according to a hierarchical startup sequence,
   the hot-swap circuit to:
      provide an indication of detection of an output voltage of a predetermined one of the plurality of voltage regulators, and
      output the indicator to the programmable device to enable operation of the programmable device.

2. The hot-swappable circuit board according to claim 1, further comprising a hot-swap controller responsive to detection of the electrical connection to control operations of the hot-swappable circuit board during insertion or removal of the hot-swappable circuit board with respect to a connector.

3. The hot-swappable circuit board according to claim 1, further comprising a first connector to connect to a connector of a backplane, the first connector to receive an output voltage from the source of power.

4. The hot-swappable circuit board according to claim 1, wherein the hot-swap circuit comprises a voltage monitor to monitor for an output voltage of the source of electrical power.

5. The hot-swappable circuit board according to claim 1, wherein the hierarchical startup sequence of the plurality of voltage regulators comprises a sequence in which startup of at least one of the voltage regulators is dependent on startup of at least another of the voltage regulators.

6. The hot-swappable circuit board according to claim 1, wherein the hot-swap circuit comprises at least one voltage monitor to provide an output signal indicating that the source of electrical power has been stable for a predetermined period of time.

7. A method comprising:
   detecting an electrical connection between a hot-swappable circuit board and a source of electrical power;
   performing a hierarchical startup sequence of a plurality of voltage regulators responsive to the detecting;
   sensing a stable electrical output from a predetermined one of the voltage regulators; and
   configuring one or more programmable devices of the hot-swappable circuit board responsive to the sensing.

8. The method according to claim 7, comprising signaling a hot-swap controller to initiate operation in response to the detecting.

9. The method according to claim 7, the predetermined one of the voltage regulators being last in the hierarchical startup sequence.

10. The method according to claim 7, further comprising:
determining that the source of electrical power has decreased in voltage below a threshold value; and
signaling for continued operation of the plurality of voltage regulators despite the determining.

11. The method according to claim 7, comprising engaging the hot-swappable circuit board with one or more connectors prior to the detecting.

12. A hot-swap circuit comprising:
a first voltage monitor to provide an indication in response to detecting a voltage of a power source during insertion of a hot-swappable circuit board into a connector;
a first buffer responsive to the indication to output a signal to cause a plurality of voltage regulators to startup according to a hierarchical startup sequence; and
a second buffer to receive an output voltage from a predetermined voltage regulator of the plurality of voltage regulators, and to output a signal indicating a stable electrical output from the predetermined voltage regulator; and
a second voltage monitor to output a signal responsive to the signal from the second buffer, to cause configuration of a programmable device on the hot-swappable circuit board.

13. The hot-swap circuit according to claim 12, wherein the second buffer is to receive the output voltage from a last one of the plurality of voltage regulators in the hierarchical startup sequence.

14. The hot-swap circuit according to claim 12, further comprising an OR logic to receive a first input responsive to the indication from the first buffer, and a second input responsive to the signal from the second buffer, the OR logic to output a signal to cause startup of a first of the plurality of voltage regulators in the hierarchical startup sequence.

15. The hot-swap circuit according to claim 12, wherein the hierarchical startup sequence of the plurality of voltage regulators comprises a sequence in which startup of at least one of the voltage regulators is dependent on startup of at least another of the voltage regulators.

* * * * *

UNITED STATES PATENT AND TRADEMARK OFFICE
CERTIFICATE OF CORRECTION

| | | |
|---|---|---|
| PATENT NO. | : 9,013,200 B2 | Page 1 of 1 |
| APPLICATION NO. | : 13/387654 | |
| DATED | : April 21, 2015 | |
| INVENTOR(S) | : Ray Woodward et al. | |

It is certified that error appears in the above-identified patent and that said Letters Patent is hereby corrected as shown below:

Claims

In column 10, line 62, in Claim 8, delete "comprising" and insert -- further comprising --, therefor.

In column 11, line 6, in Claim 11, delete "comprising" and insert -- further comprising --, therefor.

Signed and Sealed this
Third Day of November, 2015

Michelle K. Lee
*Director of the United States Patent and Trademark Office*